(12) United States Patent
Min

(10) Patent No.: US 9,558,990 B2
(45) Date of Patent: Jan. 31, 2017

(54) SEMICONDUCTOR DEVICE AND METHOD FOR FORMING THE SAME

(71) Applicant: SK hynix Inc., Icheon (KR)

(72) Inventor: Kyung Kyu Min, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/864,726

(22) Filed: Sep. 24, 2015

(65) Prior Publication Data

US 2016/0013094 A1  Jan. 14, 2016

Related U.S. Application Data

(62) Division of application No. 14/106,560, filed on Dec. 13, 2013, now Pat. No. 9,177,851.

(30) Foreign Application Priority Data

Jun. 13, 2013 (KR) .................. 10-2013-0067900

(51) Int. Cl.

| H01L 21/762 | (2006.01) |
|---|---|
| H01L 29/78 | (2006.01) |
| H01L 27/108 | (2006.01) |
| H01L 21/265 | (2006.01) |
| H01L 21/311 | (2006.01) |
| H01L 29/423 | (2006.01) |

(52) U.S. Cl.
CPC ... *H01L 21/76224* (2013.01); *H01L 21/26513* (2013.01); *H01L 21/311* (2013.01); *H01L 21/7621* (2013.01); *H01L 27/10814* (2013.01); *H01L 27/10823* (2013.01); *H01L 27/10876* (2013.01); *H01L 27/10891* (2013.01); *H01L 29/42356* (2013.01); *H01L 29/7827* (2013.01)

(58) Field of Classification Search
CPC .......................... H01L 29/78; H01L 21/76224
See application file for complete search history.

(56) References Cited

U.S. PATENT DOCUMENTS

| 2008/0121990 A1* | 5/2008 | Hasunuma ........ H01L 27/10876 257/333 |
|---|---|---|
| 2008/0253160 A1* | 10/2008 | Popp ...................... G11C 5/063 365/72 |
| 2011/0104883 A1 | 5/2011 | Nagano |
| 2011/0156135 A1* | 6/2011 | Yoon ................ H01L 27/10876 257/330 |
| 2011/0318914 A1 | 12/2011 | Choi et al. |

FOREIGN PATENT DOCUMENTS

| KR | 10-2012-0000339 A | 1/2012 |
|---|---|---|
| KR | 10-2012-0050311 A | 5/2012 |

* cited by examiner

*Primary Examiner* — Marc Armand

(57) ABSTRACT

A semiconductor device and a method for forming the same can block a moving path of electrons between neighbor buried gates. A semiconductor device includes a device isolation film formed to define an active region over a semiconductor substrate. The semiconductor device also includes a plurality of buried gates formed over the active region, and a barrier film formed between neighboring buried gates from the plurality of buried gates.

17 Claims, 21 Drawing Sheets

SEMICONDUCTOR DEVICE AND METHOD FOR FORMING THE SAME

CROSS-REFERENCE TO RELATED APPLICATION

The present application is a divisional of U.S. application Ser. No. 14/106,560, filed Dec. 13, 2013, which claims priority to Korean patent application No. 10-2013-0067900 filed on 13 Jun. 2013, the disclosures of which are hereby incorporated by reference in their entirety.

BACKGROUND

Embodiments relate to a semiconductor device and a method for forming the same, and more particularly to a semiconductor device for blocking a moving path of electrons between neighboring buried gates, and a method for forming the semiconductor device.

As the size of semiconductor devices continues to shrink, a recessed wordline or buried wordline structure in which a semiconductor substrate is etched in a manner that a recess is formed in the semiconductor substrate, has recently been proposed to improve refresh characteristics.

Application of the recessed wordline or buried wordline structure to semiconductor devices, has resulted in a reduction in the size of wordline area. However, the semiconductor device may operate abnormally due to the occurrence of an RC delay. In order to solve the abnormal operation of the semiconductor device, a wordline is generally formed of a metal material.

However, assuming that the wordline is formed of metal, a work function of the wordline is changed, so that electrons may become trapped onto the surface of $Si/SiO_2$ material of the semiconductor substrate according to on and off operations of the wordline, and then released from the $Si/SiO_2$ surface.

Specifically, electrons trapped onto the semiconductor substrate start motion when a neighbor gate or a passing gate is repeatedly turned or off, such that data of an off-state magnetic cell is changed to another.

According to the phenomenon described above, data stored in the off-state cell may be changed according to repetition of the on/off operation of neighboring wordlines, such that defective semiconductor devices occur, resulting in reduction of reliability of the semiconductor devices.

SUMMARY

Various embodiments are directed to providing a semiconductor device and a method for forming the same to address issues of the related art.

An embodiment relates to a semiconductor device for blocking a moving path of electrons between neighboring gates, and a method for forming the semiconductor device.

In an embodiment, a semiconductor device includes: a device isolation film formed to define an active region over a semiconductor substrate; a plurality of buried gates formed over the active region; and a barrier film formed between neighboring buried gates from the plurality of buried gates.

In an embodiment, the barrier film may be formed of at least one of an air gap, an insulation film, and a silicon germanium (SiGe) material. A top surface of the barrier film may be higher in height than a bottom surface of the buried gate. The semiconductor device may further include an insulation film formed along a circumference of the barrier film. The insulation film may be an oxide film. The barrier film may be formed from a material having a higher oxidation rate than the active region.

In another embodiment, a method for forming a semiconductor device includes: forming a device isolation film for defining an active region over a semiconductor substrate; forming a plurality of buried gates over the active region; and forming a barrier film between neighboring buried gates from the plurality of buried gates.

The forming the device isolation film may include: forming a trench for forming the device isolation film in the semiconductor substrate; forming a liner insulation film along a surface of the trench; and forming the device isolation film over the liner insulation film by filling a remaining portion of the trench with an insulation material.

The forming the barrier film may include: exposing a sidewall of a lower portion of the active region by forming a hole in the device isolation film formed at both sides of the active region; and forming the barrier film by oxidizing the sidewall of the lower portion of the exposed active region.

The method may further include: when the hole is formed, removing the liner insulation film of a sidewall of a lower portion of the active region on the condition that the liner insulation film of a sidewall of an upper portion of the active region remains unchanged.

The forming the barrier film may include: exposing a sidewall of a lower portion of the active region by forming a hole in the device isolation film; and forming the barrier film by oxidizing the exposed sidewall of the lower portion of the active region.

When the hole is formed, removing the liner insulation film of the sidewall of the lower portion of the active region while the liner insulation film of a sidewall of an upper portion of the active region remains; and when the air-gap-shaped barrier film is formed, the lower portion of the active region may be etched using the liner insulation film of a sidewall of an upper portion of the active region as a mask.

The method may further include: after completion of the selective etching, forming an oxide film at a top surface and bottom surface of the barrier film by oxidizing the exposed part of the active region.

The method may further include: filling the hole with an insulation material.

In accordance with another embodiment, a method for forming a semiconductor device includes: defining an active region comprising an ion implantation region in a semiconductor substrate; forming a first insulation film along a surface of the active region, and forming a second insulation film along a circumference of the ion implantation region; and forming a buried gate at both sides of the ion implantation region in the active region, and wherein the ion implantation region has a first oxidation rate and the semiconductor substrate has a second oxidation rate.

The defining the active region may include: forming the ion implantation region by implanting ions into the semiconductor substrate; and forming a device isolation region by etching the semiconductor substrate in such a manner that the ion implantation region is contained in the active region.

The defining the active region may include: forming a device isolation region by etching the semiconductor substrate, thereby also defining the active region; and forming the ion implantation region by implanting ions into the active region.

The method may further include: partially exposing a sidewall of the ion implantation region during the formation of the device isolation region. The second insulation film may be formed by oxidation through the exposed sidewall of the ion implantation region.

The first insulation film and the second insulation film comprise oxide films and be simultaneously formed. A top surface of the ion implantation region may be higher in height than a bottom surface of the buried gate. The second oxidation rate may be higher than the first oxidation rate.

It is to be understood that both the foregoing general description and the following detailed description of embodiments are exemplary and explanatory and are intended to provide further explanation of the invention as claimed.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

The embodiments relate to a technology for preventing a row hammer from occurring between neighboring gates. Such technology can be applied to various kinds of semiconductor devices.

Various embodiments will hereinafter be described with reference to FIGS. 1 to 8e.

Figure 1:
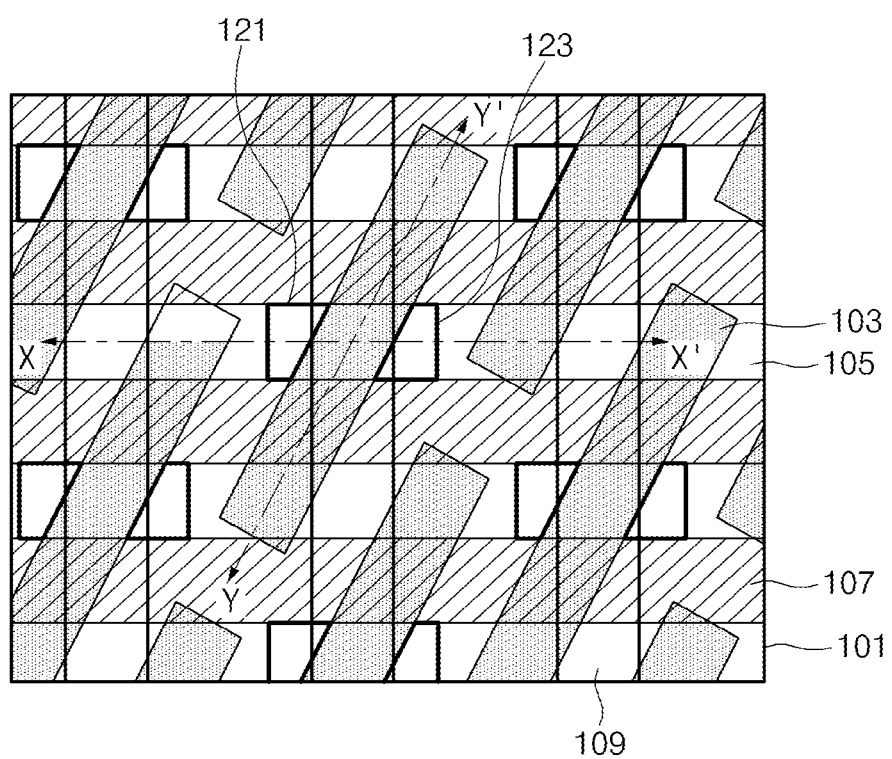
FIG. 1 is a plan view illustrating a semiconductor device according to an embodiment.
Figure 2:
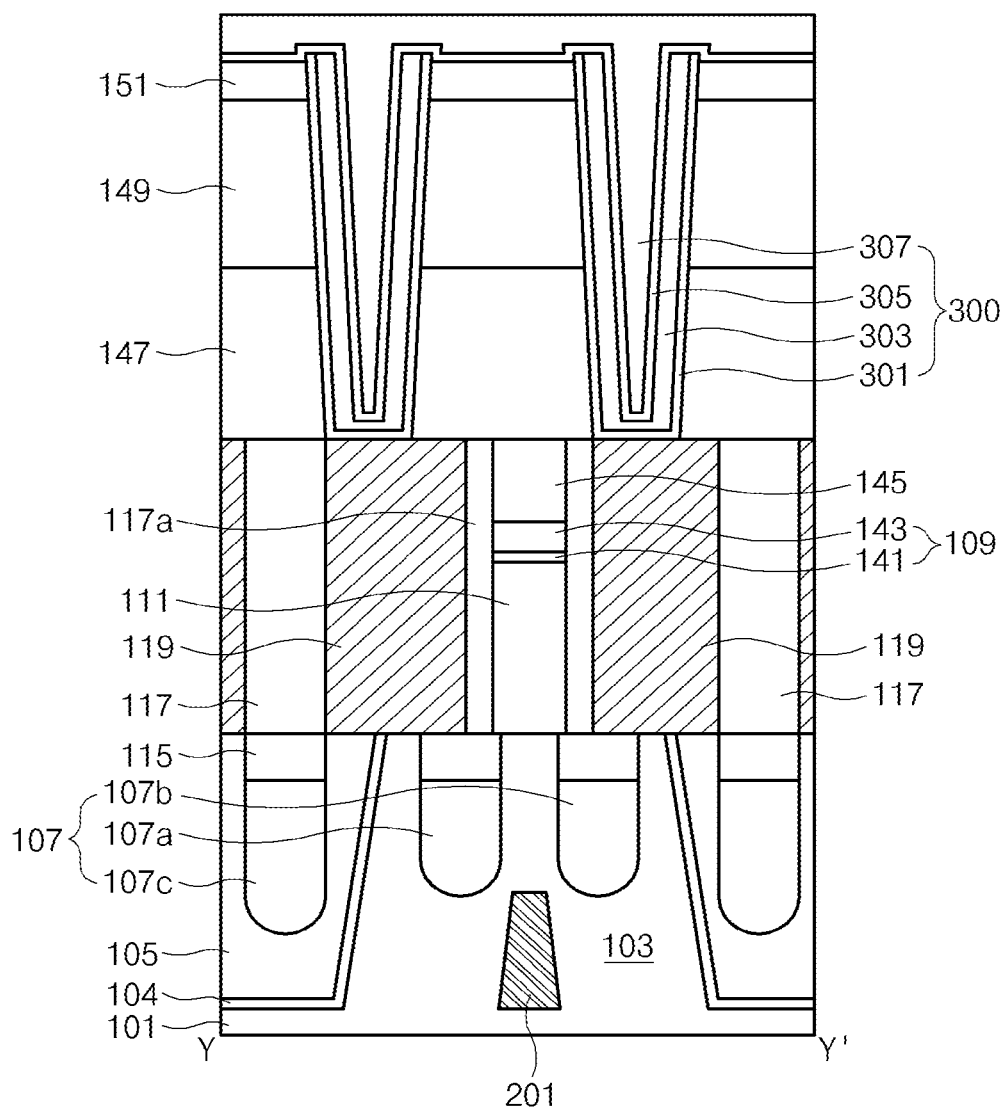
FIG. 2 is a cross-sectional view illustrating a semiconductor device according to a first embodiment.
Figure 3:
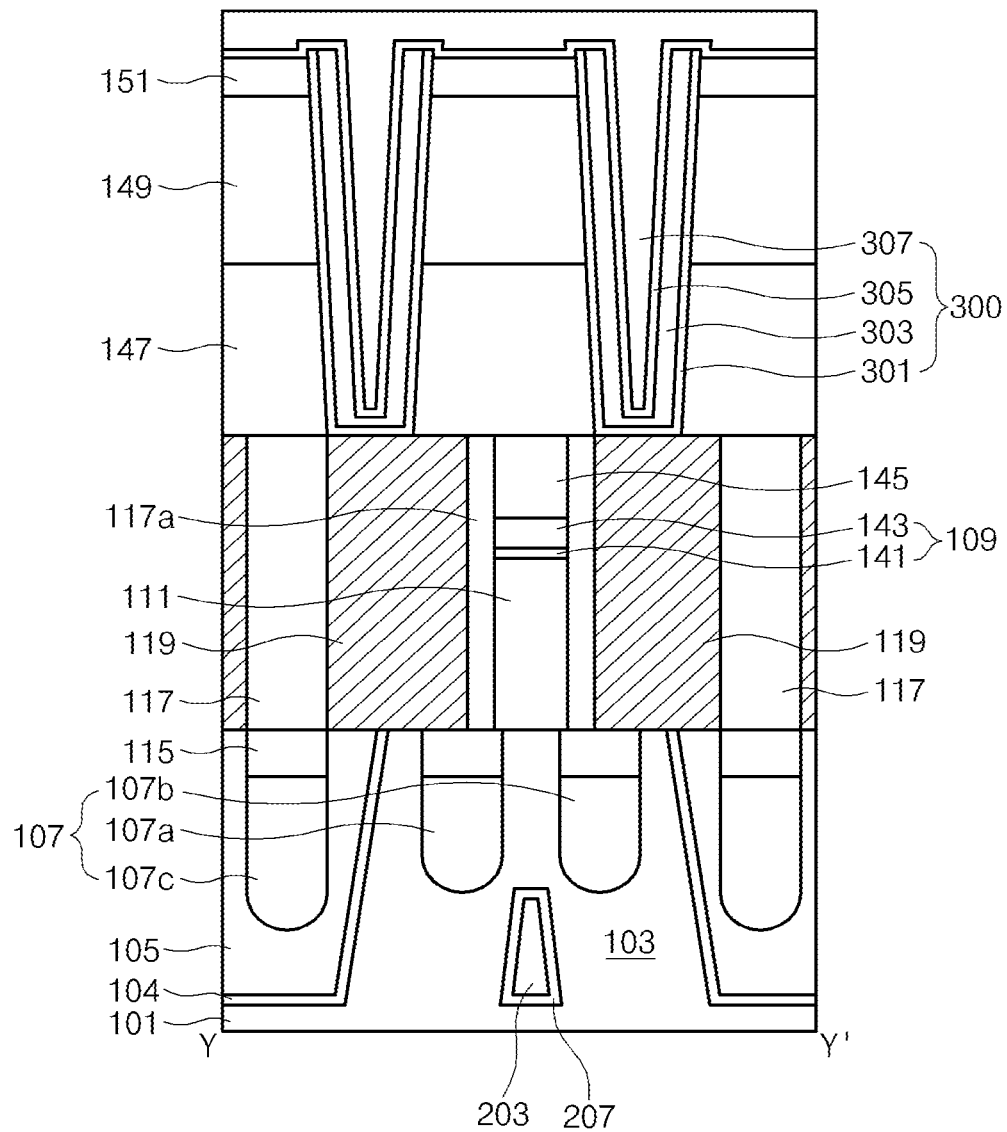
FIG. 3 is a cross-sectional view illustrating a semiconductor device according to a second embodiment.
Figure 4:
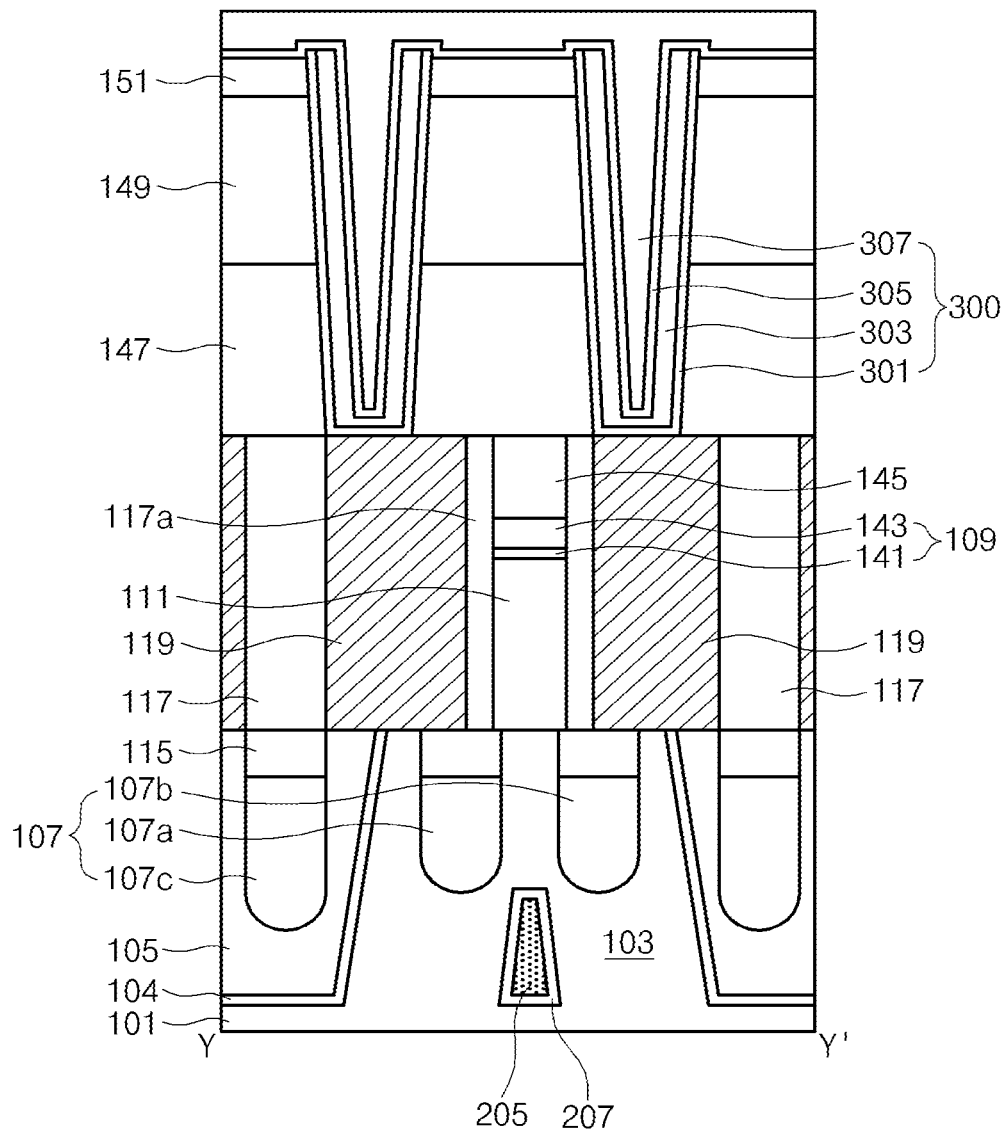
FIG. 4 is a cross-sectional view illustrating a semiconductor device according to a third embodiment.
Figure 5:
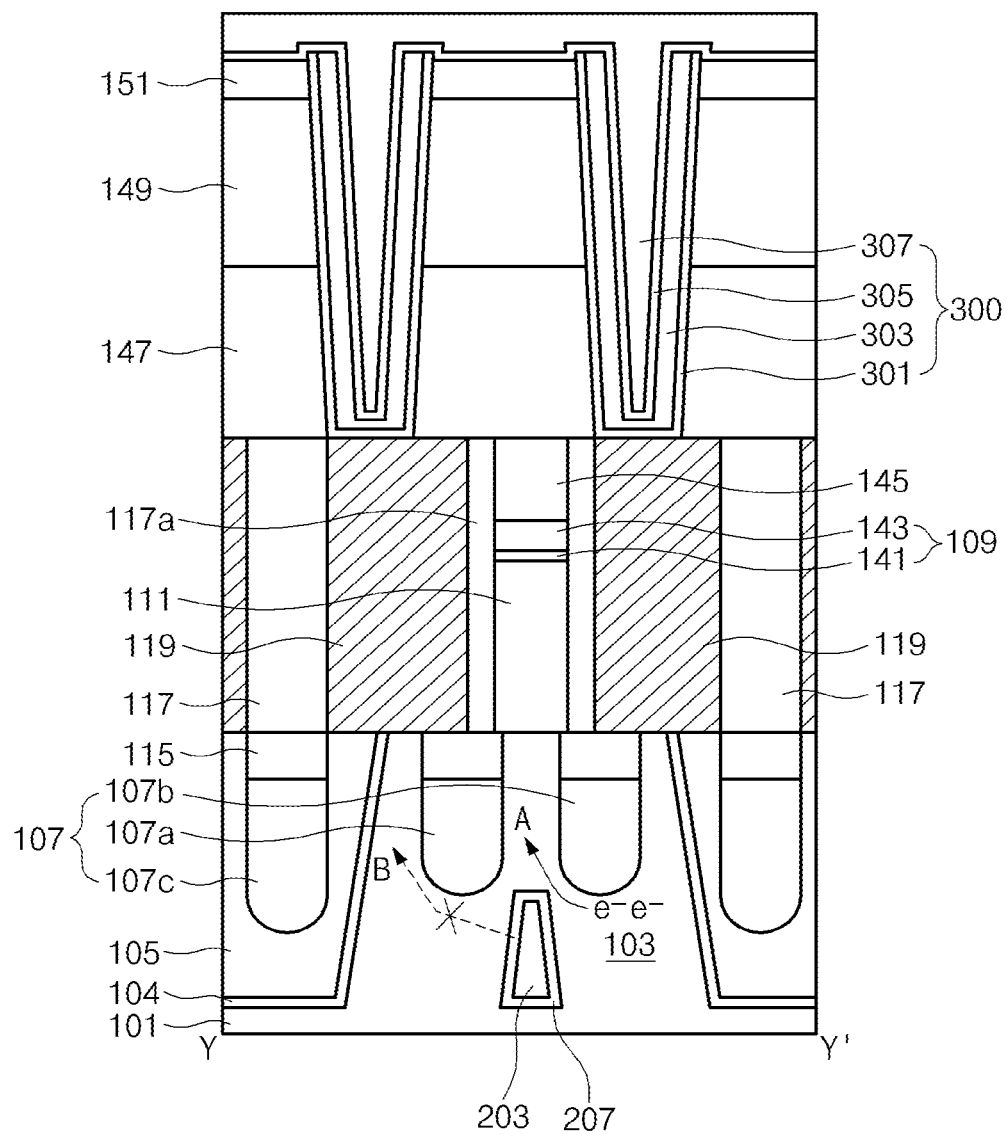
FIG. 5 is a cross-sectional view illustrating a semiconductor device showing effects of embodiments.

FIG. 1 is a plan view illustrating a semiconductor device according to an embodiment. FIGS. 2, 3, and 4 are cross-sectional views illustrating the semiconductor device of FIG. 1 taken along the line X-X'.

Referring to FIG. 1, a semiconductor device includes a plurality of active regions 103 diagonally arranged by a device isolation film 105 formed over a substrate 101; a buried gate 107 crossing the active regions 103 and the device isolation film 105; and a bit line 109 elongated perpendicular to the buried gate 107.

FIG. 2 is a cross-sectional view illustrating a semiconductor device according to a first embodiment. Referring to FIG. 2, buried gates (107a, 107b) are formed over the active region 103 and a buried gate 107c is formed in the device isolation film 105. The buried gate 107a formed over the active region 103 is referred to as a main gate, and the buried gate 107b is referred to as a neighboring or contiguous gate.

A barrier film 201 is formed between the main gate 107a and the neighboring gate 107b in the active region 103.

A bit line contact 111, a bit line 109, and a hard mask film 145 are sequentially formed over the active region 103 also between the buried gate 107a and the neighboring gate 107b, and a spacer 117a is formed at a sidewall of the bit line contact 111, bit line 109, and hard mask film 145. A storage node contact 119 is formed at a sidewall of the spacer 117a, and an insulation film 117 is formed at a sidewall of the storage node contact 119. Interlayer insulation films (147, 149) are sequentially formed over the storage node contact 119 and the insulation film 117, and a support layer 151 for supporting a cell capacitor 300 is formed over the interlayer insulation film 149. A cell capacitor 300 coupled to the storage node contact 119 is formed in the interlayer insulation films (147, 149), and the cell capacitor 300 comprises a storage node 303, dielectric films (301, 305), and a plate node 307.

Typically, as was initially described above (now described in further detail with reference to the figures), a neighboring word line (i.e., neighboring gate 107b) is repeatedly turned on and off during the operation of the semiconductor device. If the neighboring gate 107b is turned on, electrons (e−) are collected in a trap formed near the neighboring gate 107b, and if the neighboring gate 107b is then turned off, some of the collected electrons leak out to a PN junction (See 'A' of FIG. 5) of the neighboring gate 107a so that the leaked electrons flow into a bit line contact 111 between the main gate 107a and the neighboring gate 107b. However, some electrons do not leak out to the PN junction (See 'A' of FIG. 5) of the neighboring gate 107b. Instead, these electrons pass around the main gate 107a and move to a PN junction (See 'B' of FIG. 5) of the main gate 107a so that the leaked electrons flow into a storage node contact 119 coupled to the PN junction. These electrons shifted to the storage node contact 119 move to a main cell capacitor 300 coupled to the main gate 107a, and thus affect data stored in the main cell capacitor 300.

For example, assuming that data of 1 is stored in the main cell capacitor 300, the electrons deviating from the path to the PN junction of the neighboring gate 107b and flowing into the main cell capacitor 300 are combined with holes of the cell capacitor 300, thereby resulting in reduction of a voltage across the main cell capacitor 300. By repetition of the above-mentioned processes, a voltage level of the cell capacitor 300 may drop to a low voltage level at which the data of 1 is misread as data of 0, which results in the occurrence of data failure. The above-mentioned phenomenon is referred to as a "WL dist" or a "row hammer." In order to address the above-mentioned issue, as shown in FIG. 2, a barrier film 201 is formed between the main gate 107a and the neighboring gate 107b, such that the barrier film 201 prevents electrons from moving to the PN junction (See 'B' of FIG. 5) of the main gate 107a during the off operation of the neighboring gate 107b. Instead, due to the presence of the barrier film 201, these electrons move to the bit line contact 111. In addition, since an electric field is formed between the bit line contact 111 and the active region 103 to attract the electrons near the bit line, it is more difficult for the electrons to move to the PN junction of the main gate 107a. The barrier film 201 may be implemented as an insulation film such as an oxide film as shown in FIG. 2, or may be implemented as an air gap 203 as shown in FIG. 3, or may be implemented as an SiGe film 205 as shown in FIG. 4.

Figure 6A:
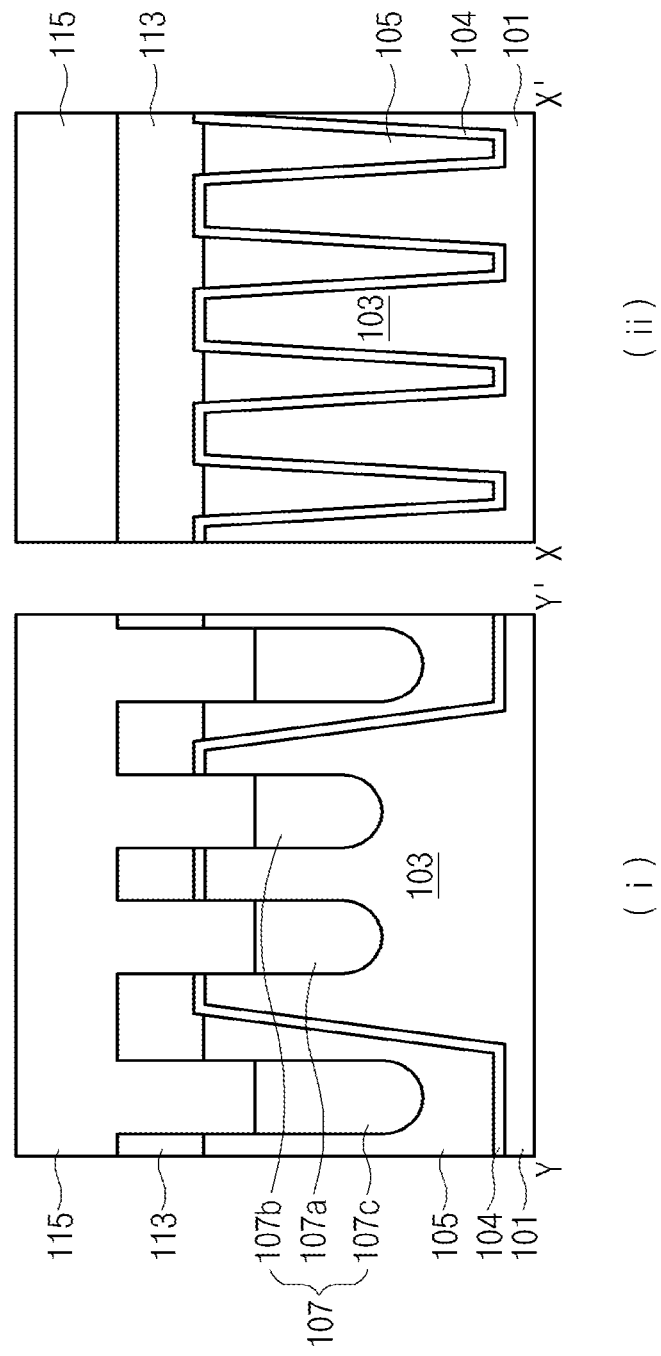
FIGS. 6a to 6h are cross-sectional views illustrating fabrication processes of the semiconductor device according to the first embodiment.
Figure 6B:
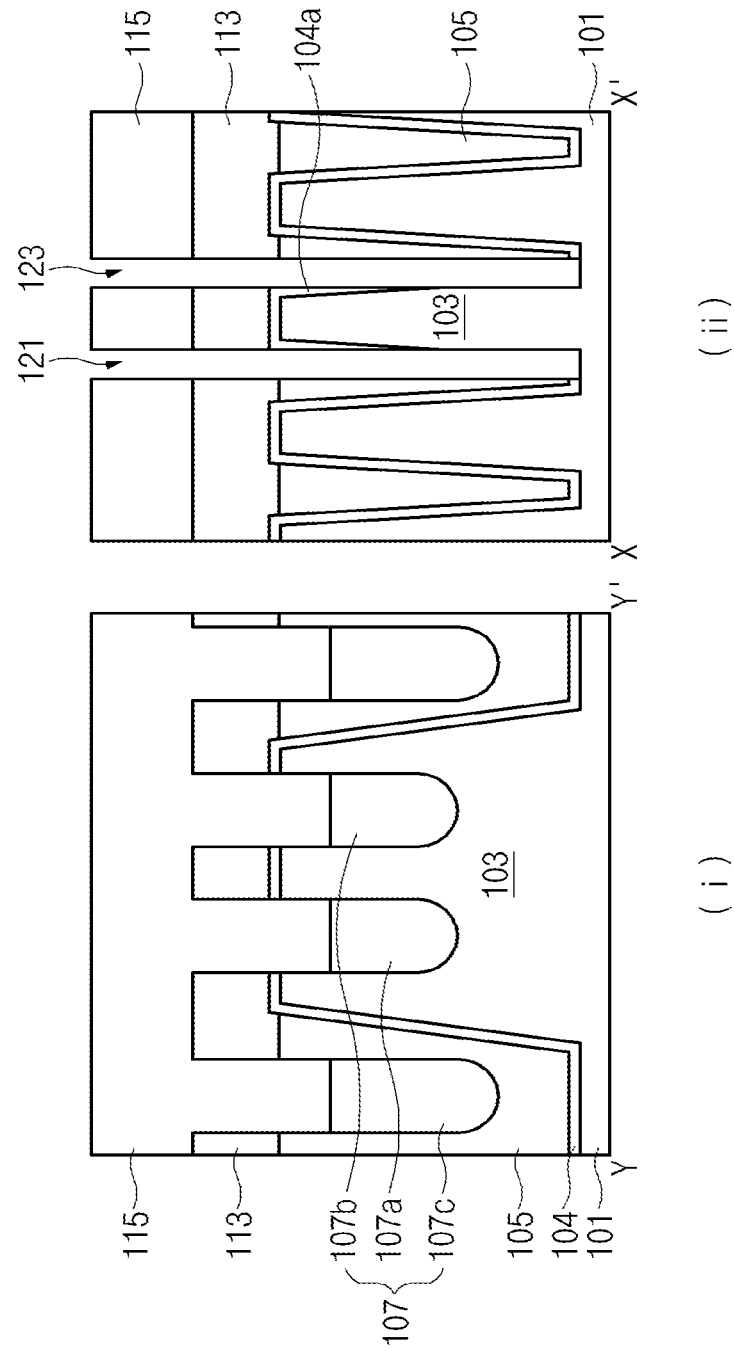
Figure 6C:
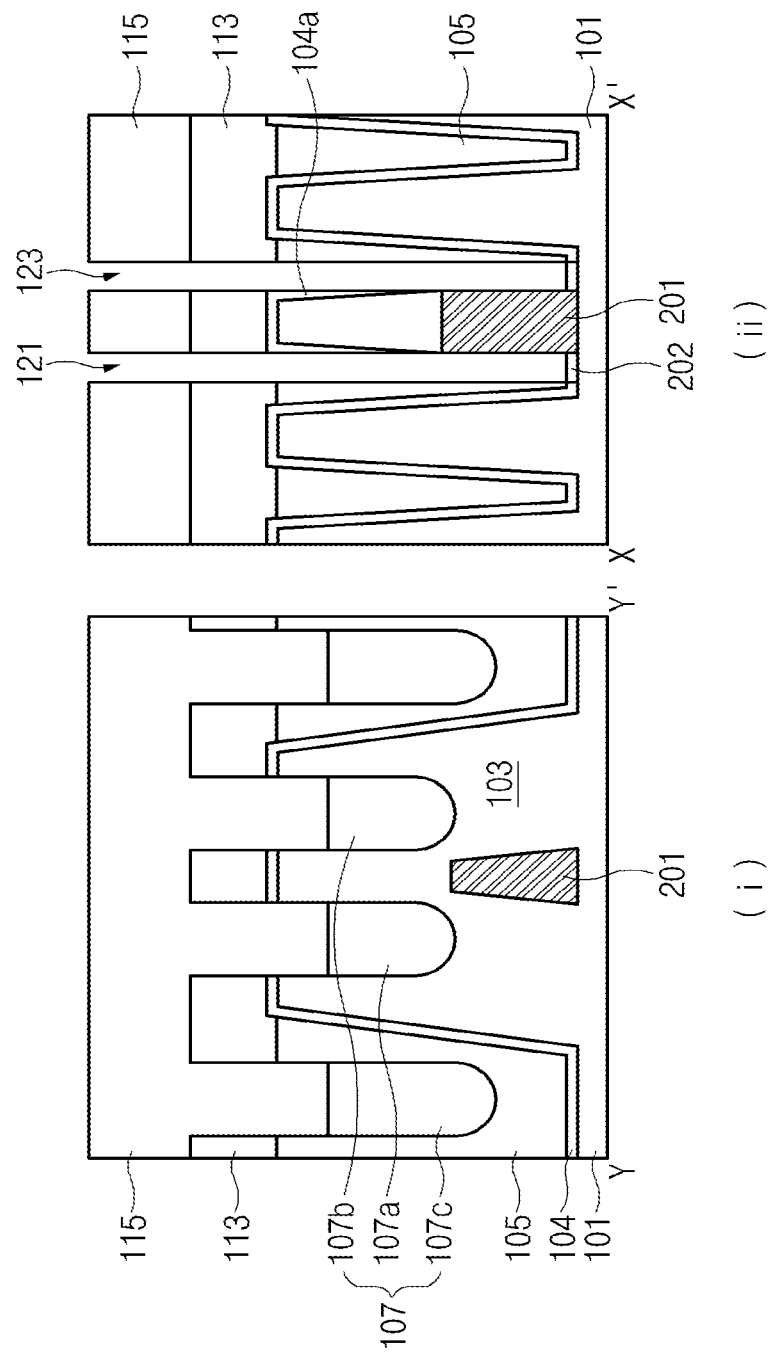
Figure 6D:
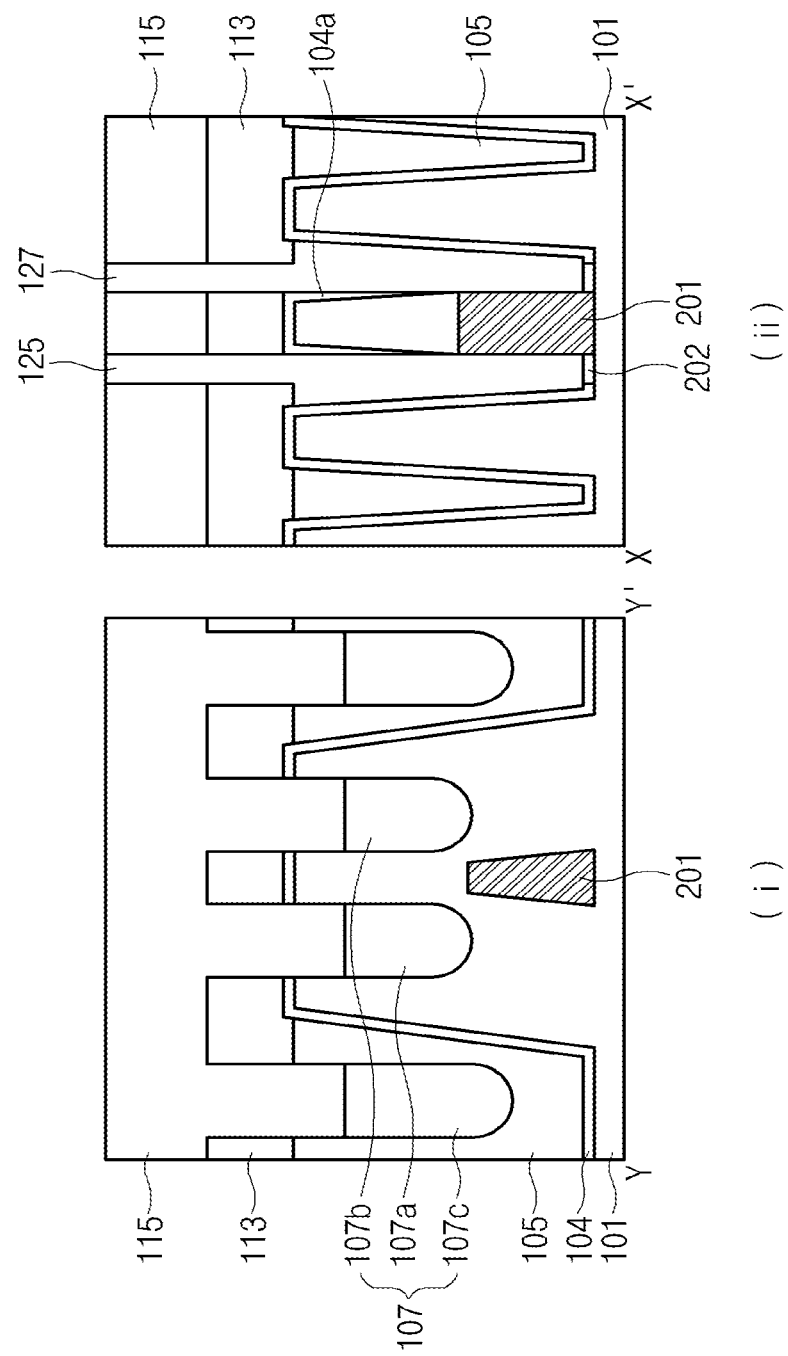
Figure 6E:
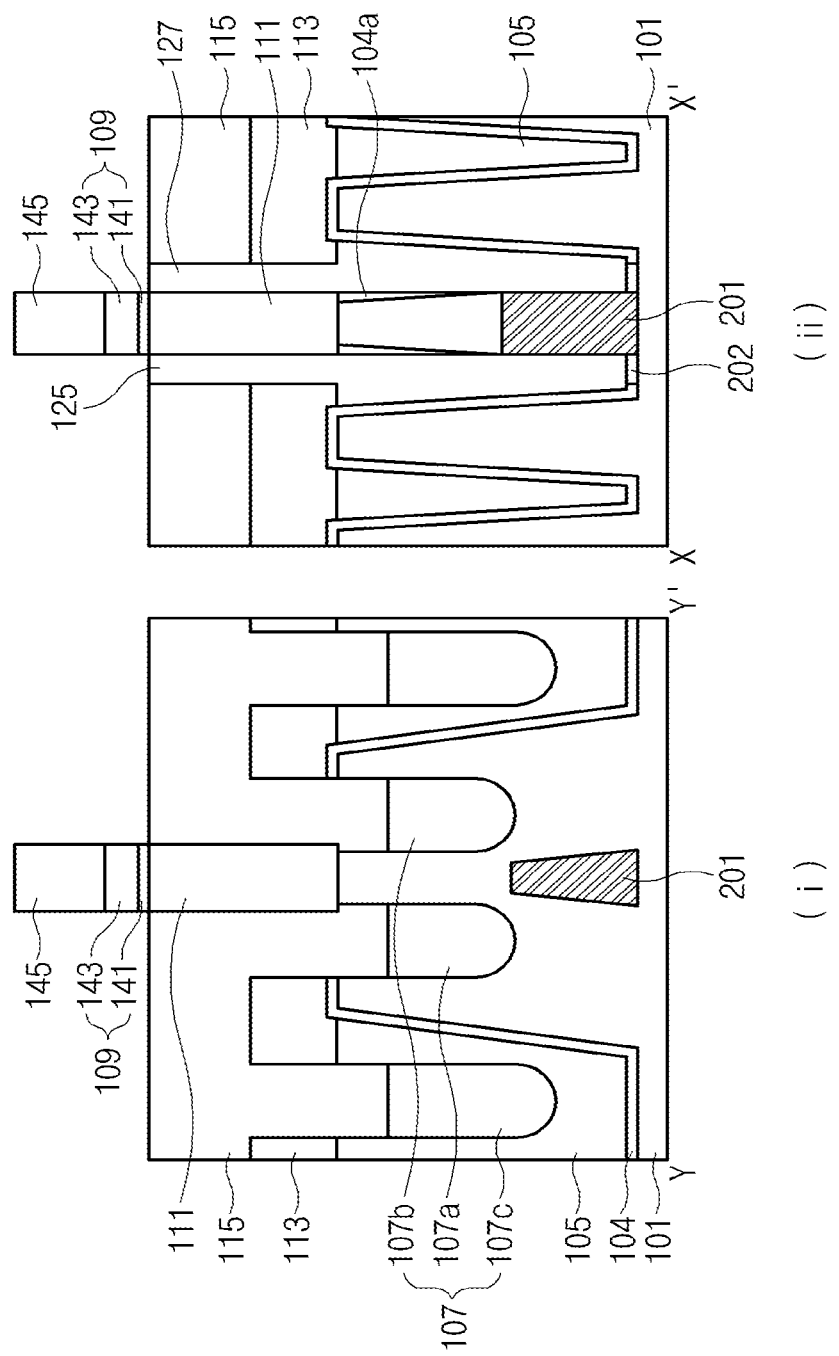
Figure 6F:
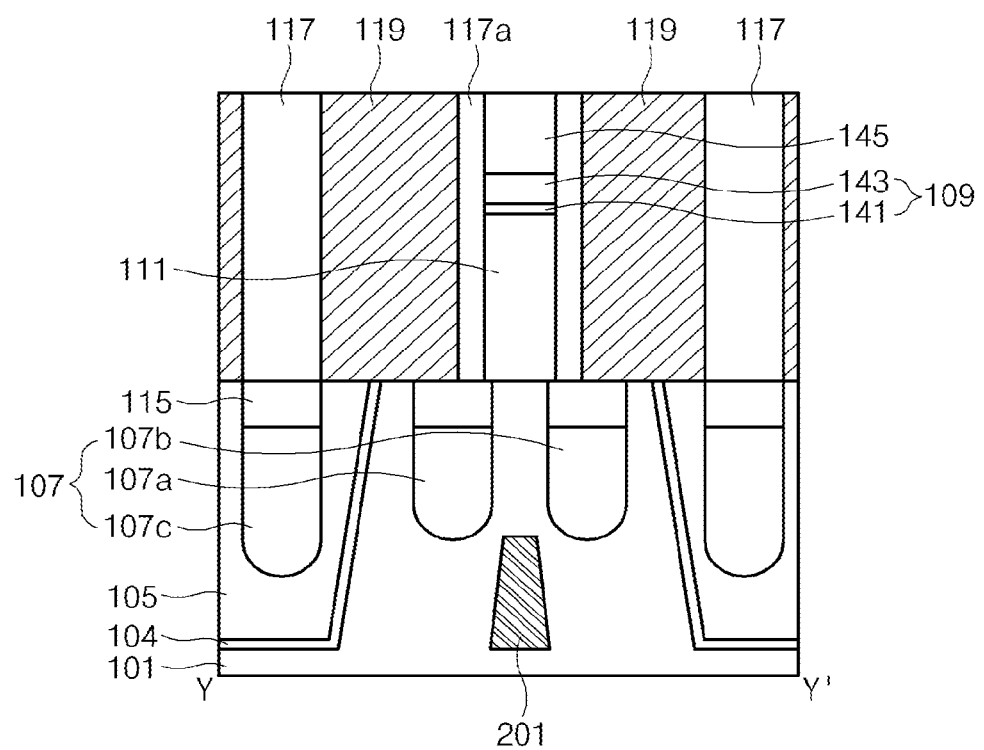
Figure 6G:
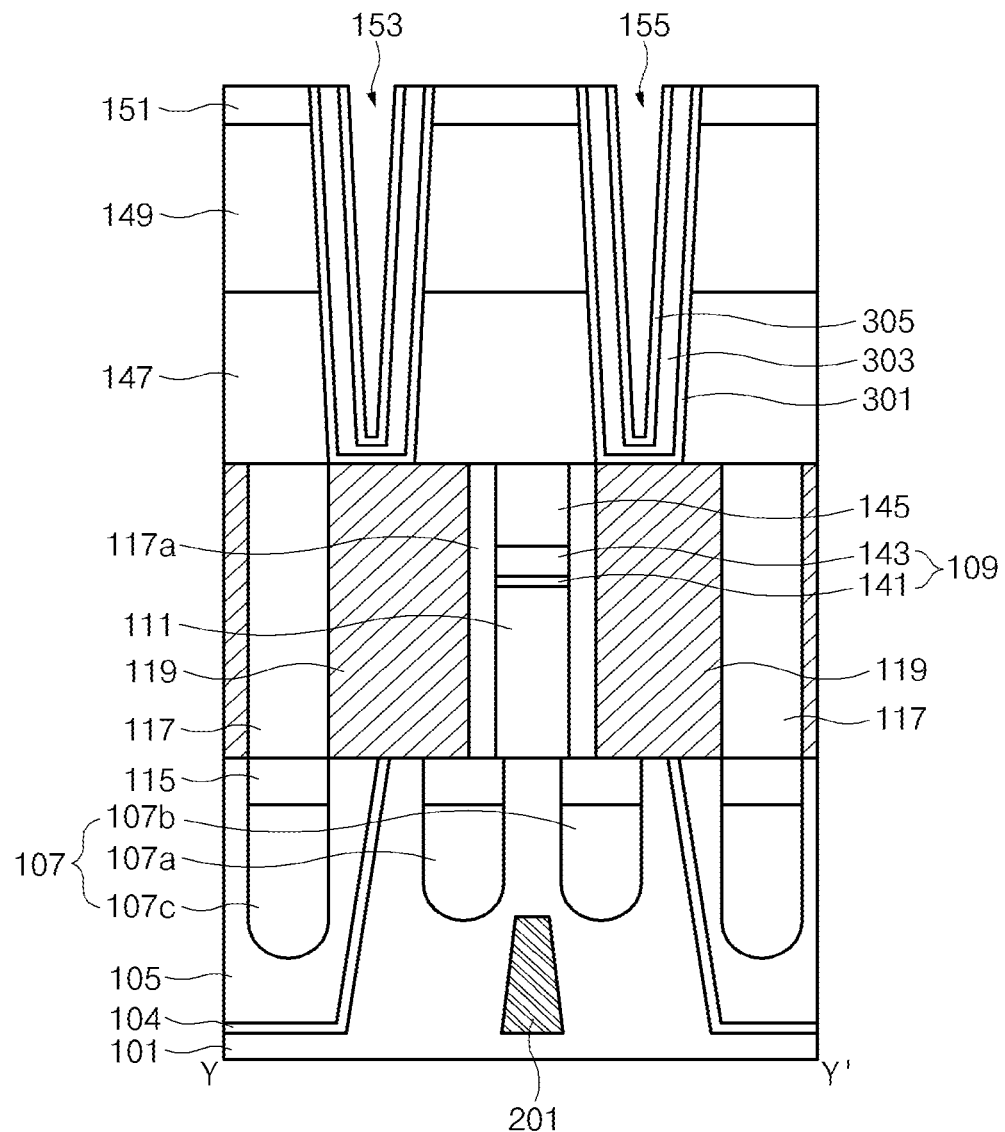
Figure 6H:
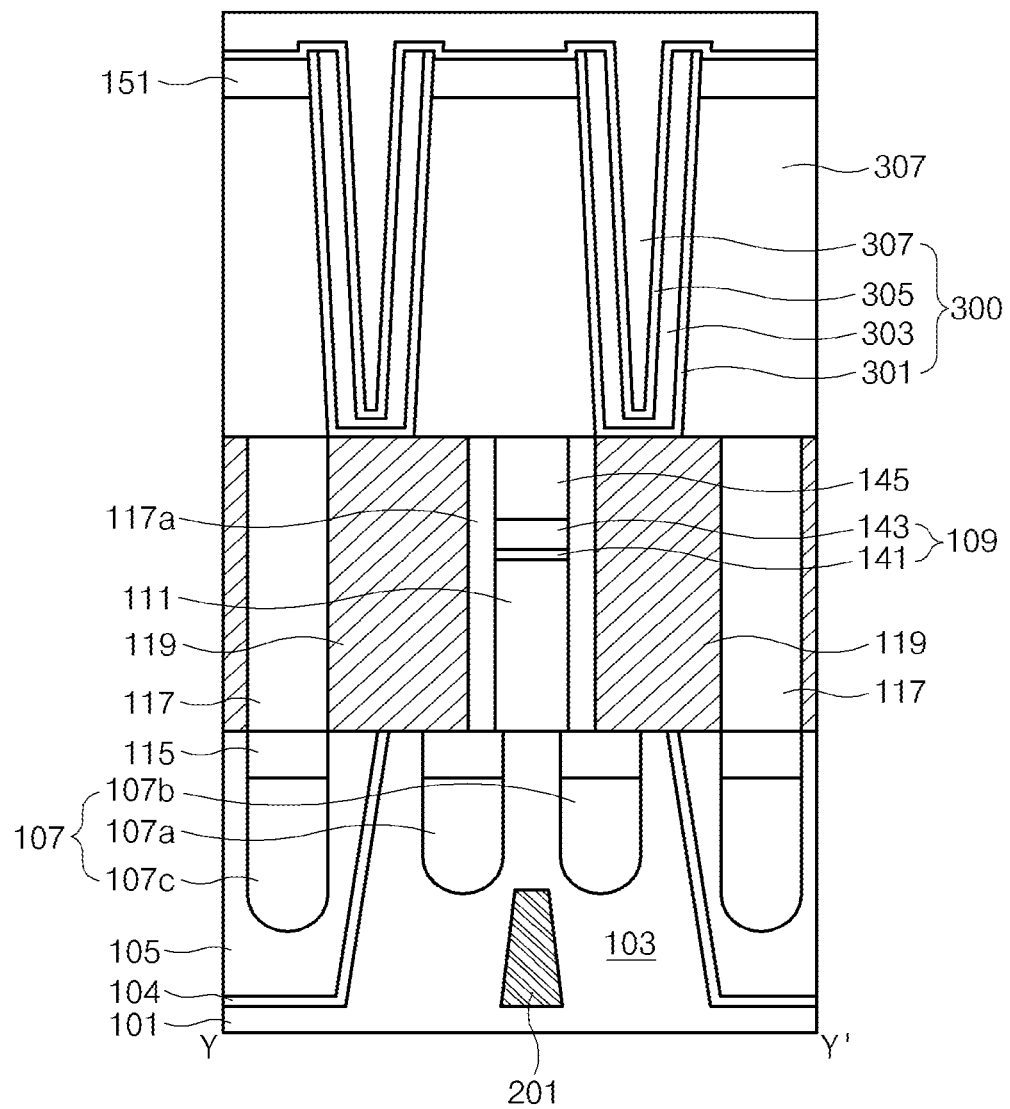

FIGS. 6a to 6h are cross-sectional views illustrating fabrication processes of the semiconductor device according to the first embodiment. In each of FIGS. 6a to 6e, (i) is a cross-sectional view illustrating the semiconductor device taken along the line Y-Y' of FIG. 1, and (ii) is a cross-sectional view illustrating the semiconductor device taken along the line X-X' of FIG. 1. Each of FIGS. 6f to 6h is a cross-sectional view illustrating the semiconductor device taken along the line Y-Y' of FIG. 1.

Referring to FIG. 6a, a device isolation film 105 is formed over a semiconductor substrate 101 to define the active region 103. In an embodiment, the device isolation film 105 is formed by first forming a trench (not shown) in the semiconductor substrate 101. Thereafter, the liner oxide film 104 is formed along a step coverage between the semiconductor substrate 101 and the entire surface of the trench, and an upper part of the liner oxide film 104 is filled with an insulation material, resulting in formation of the device isolation film 105. Although not shown in FIG. 6a, a liner nitride film (not shown) may be formed over the liner oxide film 104 as needed. A hard mask 113 is formed over the active region 103 and the device isolation film 105 in order to form the buried gates 107 (107a, 107b, 107c). Specifically, the buried gates (107a, 107b, 107c) are formed in the active region 103 and the device isolation film 105 using the hard mask 113 as a mask.

In this embodiment, the buried gates 107 formed in the active region 103 are referred to as a main gate 107a and a neighboring gate 107b. Subsequently, a capping film 115 is formed over the buried gates 107. In an embodiment, the buried gates 107 may comprise a conductive material such as tungsten and/or polysilicon, and the capping film 115 may comprise a nitride material or the like.

Referring to FIG. 6b, both sides of the device isolation film 105 arranged in the direction of the line X-X' of the active region 103 between the main gate 107a and the neighboring gate 107b, are etched so that holes (121, 123) are formed. In this embodiment, the liner oxide film 104 formed at the bottom of the device isolation film 105 is also etched to expose the semiconductor substrate 101. Since the oxide film 104a on a sidewall of an upper portion of the active region 103 remains unchanged and an oxide film of a sidewall of a lower portion of the active region 103 is removed, the sidewall of the lower portion of the active region 103 is exposed.

Referring to FIG. 6c, the sidewall of the lower portion of the exposed active region 103 and the semiconductor substrate 101 are heated, and thus oxidized. Accordingly, the lower portion of the active region 103 is oxidized so that it defines a barrier film 201. An oxide film 202 is formed over the bottom surface of the holes (121, 123). In other embodiments, the barrier film 201 may be formed of an insulation film material such as a nitride film, or the like.

Referring to FIG. 6d, the insulation materials (125, 127) are deposited in a manner that the holes (121, 123) may be filled with the insulation materials (125, 127), and then the insulation materials (125, 127) are optionally subjected to a planarization process such as a chemical mechanical polishing (CMP) process.

Referring to FIG. 6e, as mentioned above, the hard mask film 113 is formed over the active region 103 between the buried gates (107a, 107b). In this embodiment, the insulation film 115 is also etched to form a bit line contact hole (not shown). In this embodiment, the liner nitride film 104 over an upper portion of the active region 103 is also etched during the formation of the bit line contact hole, so that the upper portion of the active region 103 is exposed. Thereafter, a conductive material is filled in the bit line contact hole and then subjected to a subjected to a planarization process such as CMP, resulting in formation of a bit line contact 111. Subsequently, a barrier metal 141, a conductive film 143, and a hard mask film 145 are sequentially deposited over the bit line contact 111. Also, the insulation film 115, the barrier metal 141, the conductive film 143, and the hard mask film 145 are etched using a bit line mask (not shown), resulting in formation of a bit line 109. The bit line 109 may comprise a laminate structure of the barrier metal 141 and the conductive film 143.

Thereafter, referring to FIG. 6f, a spacer 117a is formed at a sidewall of the bit line 109, and a storage node contact 119 is formed between the spacer 117a and the nitride film 117 formed over the device isolation film 105.

Subsequently, referring to FIG. 6g, interlayer insulation films (147, 149) and a support layer 151 are sequentially deposited over the bit line 109, the storage node contact 119, and the nitride film 117. Then, the interlayer insulation films (147, 149) and the support layer 151 are partially etched so that trenches (153, 155) are formed to expose the storage node contact 119. Thereafter, a first dielectric film 301, a storage node 303 and a second dielectric film 305 are sequentially formed over an entire surface including regions inside the trenches (153, 155) and the storage node 303 are planarized to expose the support layer 151.

Subsequently, referring to FIG. 6h, the interlayer insulation films (147, 149) are completely removed on the condition that the storage node 303, the dielectric films (301, 305), and the support layer 151 remain unchanged. a plate node 307 is deposited in the trenches (153, 155), resulting in formation of a capacitor 300. In addition to the above-described fabrication method, other established methods in the art for forming a bit line and a capacitor of a general semiconductor device may be applied to the semiconductor device shown in FIGS. 6e to 6h.

As described above, according to the semiconductor device of an embodiment, when the neighboring gate 107b is turned on or off, electrons trapped near the neighboring gate 107b are blocked by the barrier film 201 from moving to a PN junction (See B in FIG. 5) of the main gate 107a. Instead, the electrons move to a PN junction (See A in FIG. 5) of the neighboring gate 107b.

Figure 7A:
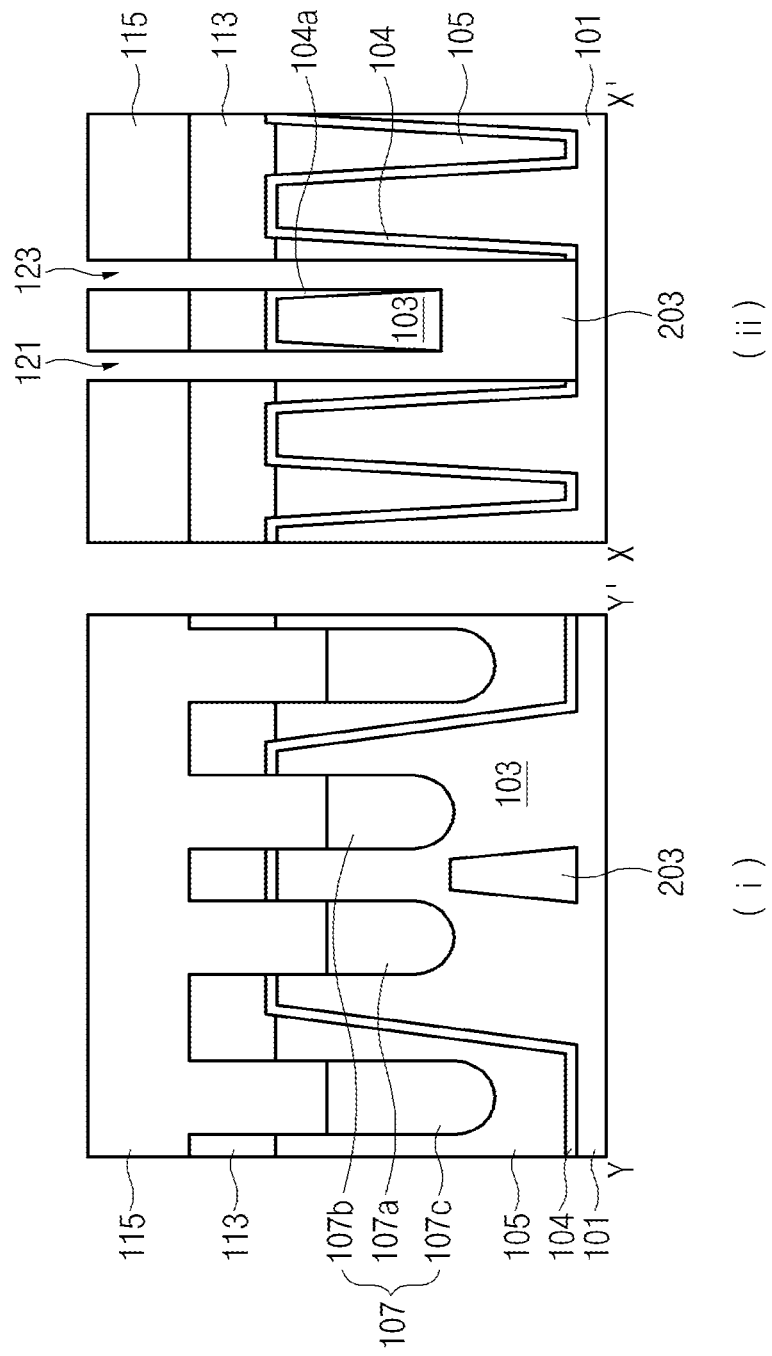
FIGS. 7a to 7c are cross-sectional views illustrating fabrication processes of the semiconductor device according to the second embodiment.
Figure 7B:
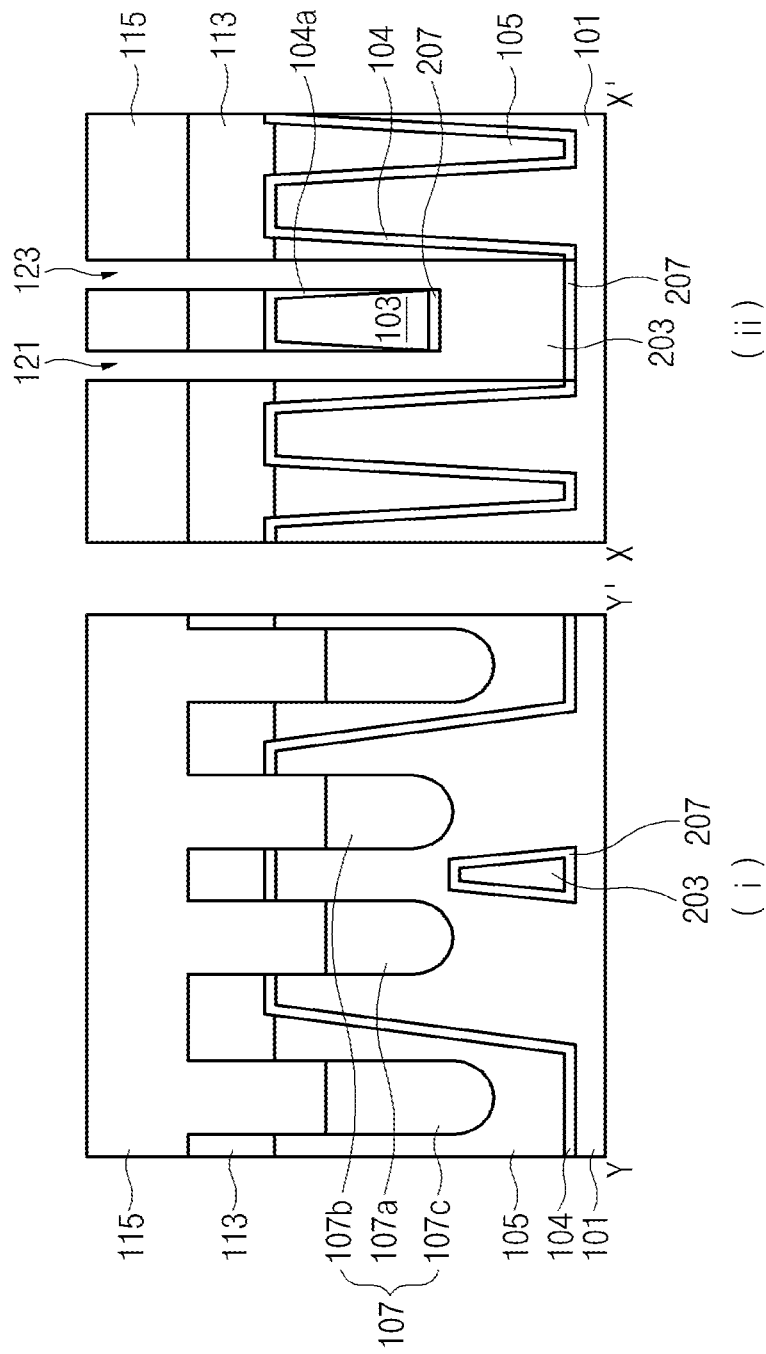
Figure 7C:
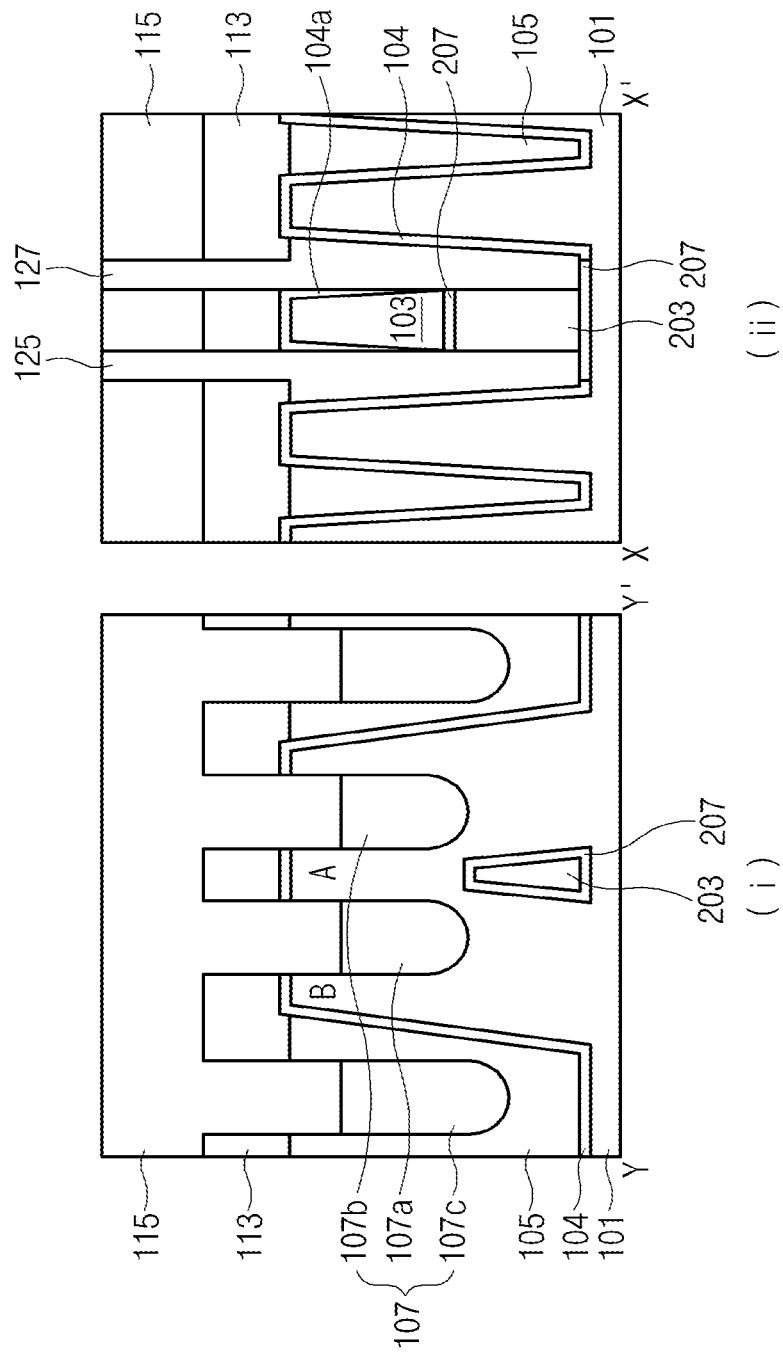

FIGS. 7a to 7c are cross-sectional views illustrating fabrication processes of the semiconductor device according to a second embodiment. In each of FIGS. 7a to 7c, (i) is a cross-sectional view illustrating the semiconductor device taken along the line Y-Y' of FIG. 1, and (ii) is a cross-sectional view illustrating the semiconductor device taken along the line X-X' of FIG. 1. The second embodiment shows that the barrier film 203 may also comprise an air gap.

Referring to FIGS. 6a and 6b, after the buried gate 107 is formed in the semiconductor substrate 101, holes (121, 123) are formed in the device isolation film 105 of both sidewalls of the active region 103. Specifically, when the holes (121, 123) are formed as shown in FIG. 6b, the oxide film 104a formed at a sidewall of an upper portion of the active region 103 is not etched and the oxide film formed at a sidewall of a lower portion of the active region 103 is etched. Accordingly, the oxide film formed at a sidewall of the lower portion is removed while the oxide film 104a formed at a sidewall of the upper portion of the active region 103 remains, such that the sidewall of the lower portion of the active region 103 is exposed.

Referring to FIG. 7a, the sidewall of the lower portion of the exposed active region 103 is selectively etched using the oxide film 104a (see FIG. 6b) of the sidewall of the upper portion of the active region 103 as a mask. As a result, the lower portion of the active region 103 is removed on the condition that the upper portion of the active region 103 between the holes (121, 123) remains unchanged, which leads to formation of an air gap between the holes (121, 123). This air gap is used as a barrier film 203. Accordingly, a barrier film 203 comprising an air gap is formed at a lower portion of the active region 103 between the main gate 107*a* and the neighboring gate 107*b*.

Subsequently, referring to FIG. 7*b*, a surface of the active region 103 is formed over a top surface of the exposed barrier film 203. The surface of the active region 103 and the semiconductor substrate 101 disposed at a bottom surface of the barrier film 203 are heated for surface oxidization, such that an oxide film 207 is formed.

Referring to FIG. 7*c*, an insulation material such as a nitride material is filled in the holes (121, 123) of both sidewalls of the active region 103, such that an air gap is formed only at the lower portion of the active region 103. In an embodiment, the top surface of the barrier film 203 is lower in height than a predetermined position corresponding to a half (½) of the active region 103, and/or is higher in height than a bottom surface of the main gate 107*a* and the neighboring gate 107*b*. In addition, the bottom surface of the barrier film 203 may be disposed at the same height as a bottom surface of the device isolation film 105, and/or may be lower or higher in height than a bottom surface of the device isolation film 105. In a particular embodiment, the upper surface of the barrier film 203 is disposed at a predetermined height that is higher than a bottom surface of the device isolation film 105 so as to prevent movement of electrons.

Subsequently, the bit line contact 111, the bit line 109, the storage node contact 119, and the cell capacitor 300 are formed as described above with respect to the first embodiment and FIGS. 6*e* to 6*h*.

As described above, according to the semiconductor device of the embodiment, when the neighboring gate 107*b* is turned on or off, electrons generated in the neighboring gate 107*b* are blocked by the barrier film 203 formed of an air gap, such that the electrons do not move to the PN junction "B" of the main gate 107*a*, but move to the PN junction "A" of the neighboring gate 107*b*.

Figure 8A:
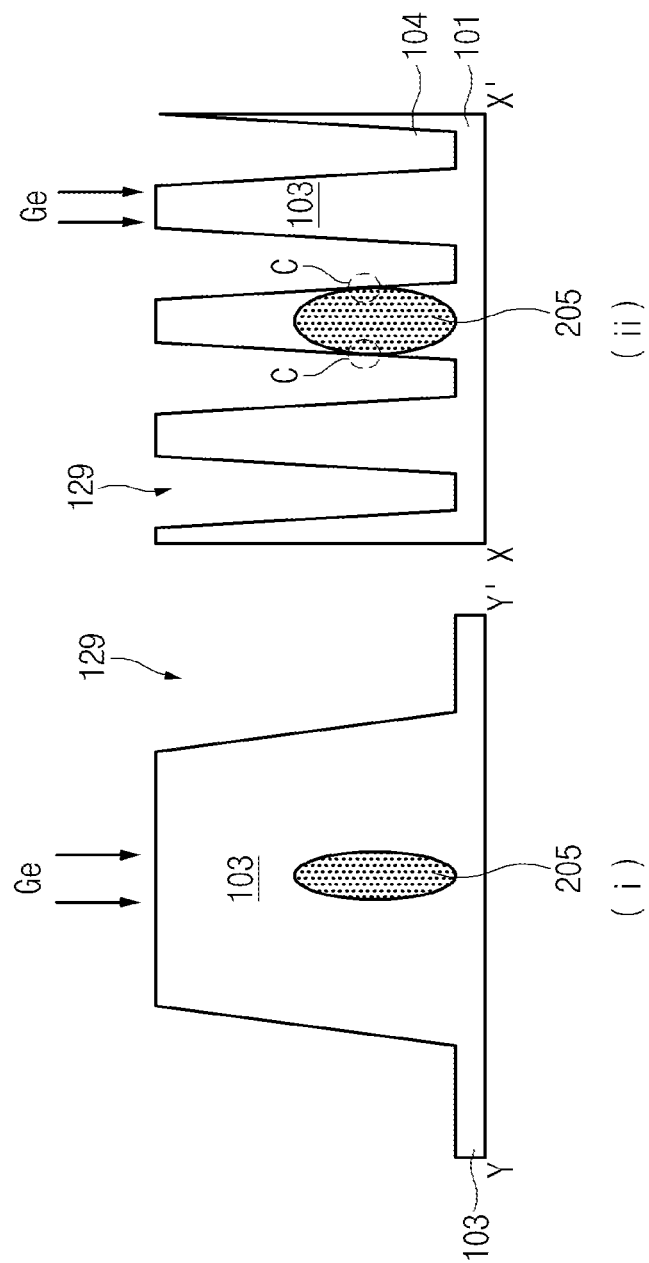
FIGS. 8a to 8e are cross-sectional views illustrating fabrication processes of the semiconductor device according to the third embodiment.

FIGS. 8*a* to 8*e* are cross-sectional views illustrating fabrication processes of the semiconductor device according to the third embodiment. In each of FIGS. 8*a* to 8*e*, (i) is a cross-sectional view illustrating the semiconductor device taken along the line Y-Y' of FIG. 1, and (ii) is a cross-sectional view illustrating the semiconductor device taken along the line X-X' of FIG. 1. Referring to FIG. 8*a*, after a trench 129 for forming the device isolation film 105 is formed by etching a semiconductor substrate 101, germanium (Ge) ions are implanted into the active region 103 so that a barrier film 205 is formed. In an embodiment, a top surface of the barrier film 205 may be lower in height than a predetermined position corresponding to a half (½) of the active region 103. In addition, a bottom surface of the barrier film 205 may be disposed at the same height, or may be disposed higher or lower in height than a bottom surface of the trench 129. It is understood, however, that a height of the top or bottom surface of the barrier film 205 may not be limited as shown in FIG. 8*a*. In addition, the barrier film 205 may be located between the buried gates 107 (see FIG. 8*d*). As can be seen from FIG. 8*a*, in an embodiment, germanium (Ge) ions are implanted into the active region 103 after the formation of the trench 129. Alternatively, in another embodiment, after the barrier film 205 is formed by implanting Ge ions into the semiconductor substrate 101, the trench 129 for forming the device isolation film 105 is formed.

Figure 8B:
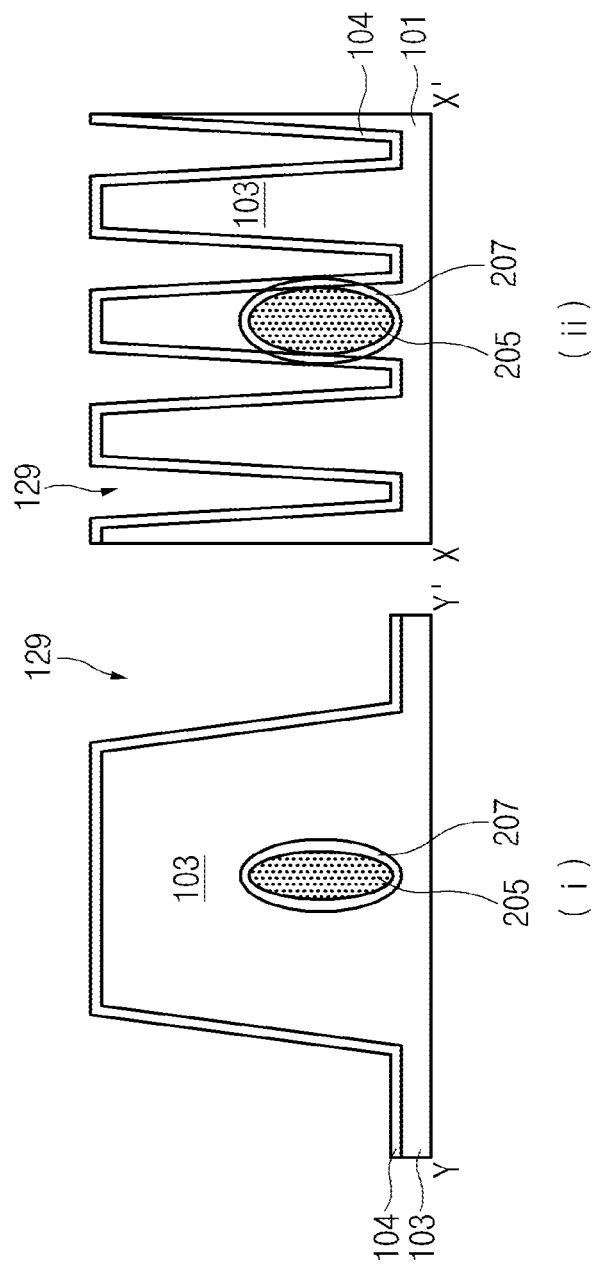

Thereafter, as can be seen from FIG. 8*b*, the liner oxide film 104 is formed through thermal processing along step coverage of the exposed semiconductor substrate 101. Although not shown in FIG. 8*b*, it should be noted that a liner nitride film (not shown) may also be formed over the liner oxide film 104. In this embodiment, the surface C (see FIG. 8*a*) of the barrier film 205 acting as a germanium (Ge) ion region formed at a lower portion of the active region 103 is oxidized by heat, such that an oxide film 207 is formed. Specifically, as shown in FIG. 8*a*, heat is applied to the surface C where the barrier film 205 is exposed to the trench 129 such that the semiconductor device is oxidized. Since the silicon germanium (SiGe) has a higher oxidation rate than the silicon (Si), oxidation occurs in a radially inward and circumferential direction in the barrier film 205 at a faster rate than in the active region adjacent to the barrier film 205. As a result, the oxide film 207 is formed along a circumference of the barrier film 205. Therefore, when the active region 103 and the trench 129 are oxidized, the surface of the SiGe material of the barrier film 205 contained in the active region 103 is oxidized so that the oxide film 207 is formed.

The term "oxidation rate" indicates a degree of oxidation generated under the same oxidation condition, and the high oxidation rate may indicate the occurrence of faster oxidation. In addition, the oxidation rate of the SiGe material may be controlled by controlling the density of germanium (Ge) ions implanted into the semiconductor device of FIG. 8*a*. Generally, the oxidation rate increases in proportion to the density of germanium (Ge) ions. The oxidation rates of SiGe and Si are described in U.S. Pat. No. 5,963,817, the entirety of which is hereby incorporated by reference.

Figure 8C:
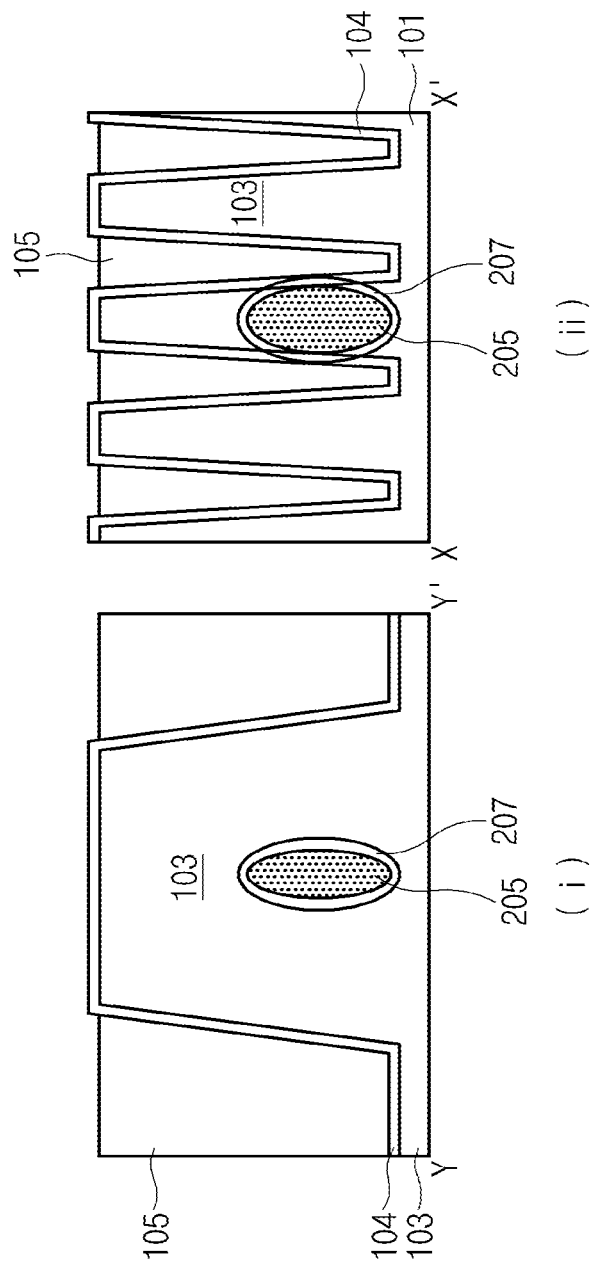

Subsequently, in an embodiment, as can be seen from FIG. 8*c*, an insulation material such as a nitride material is filled in the trench 129 such that formation of the device isolation film 105 is completed.

Figure 8D:
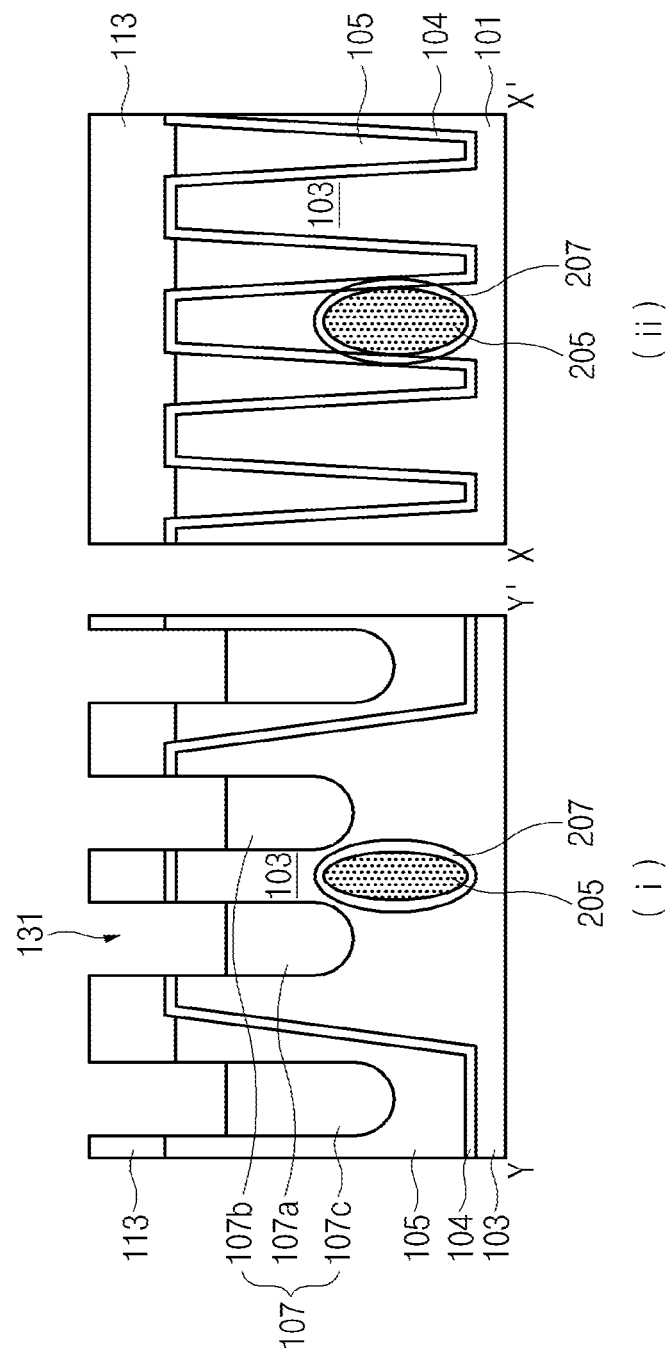

Referring to FIG. 8*d*, a hard mask film 113 is formed over the active region 103 and the device isolation film 105. The active region 103 and the device isolation film 105 are etched using the hard mask film 113 as a mask, such that a recess 131 for forming the buried gate 107 is formed.

Figure 8E:
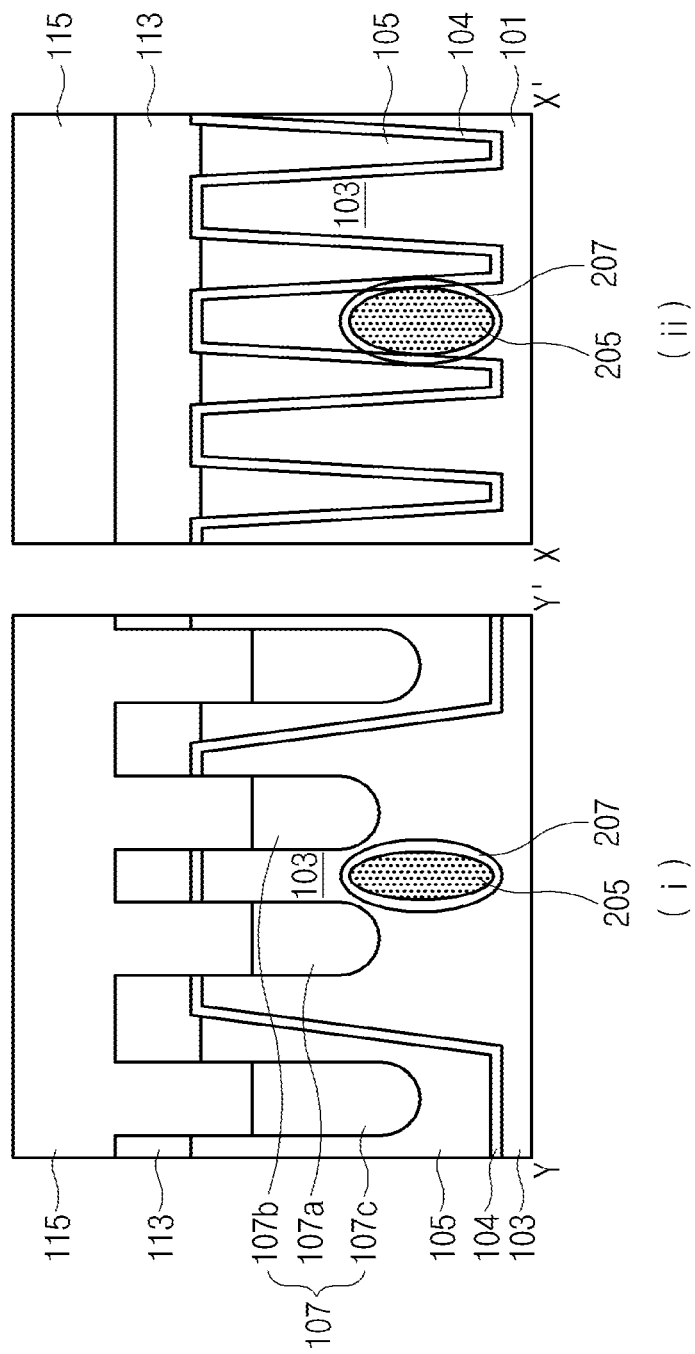

Referring to FIG. 8*e*, a lower portion of the recess 131 is filled with a conductive material to form the buried gate 107, and an insulation material is deposited over the buried gate 107, such that an insulation film 115 is formed.

The bit line contact 111, the bit line 109, the storage node contact 119, and the capacitor 300 are formed as described above with respect to the first embodiment and as shown in FIGS. 6*e* to 6*h*.

As described above, a barrier film 205 formed of SiGe is formed between the main gate 107*a* and the neighboring gate 107*b* to block a movement path of electrons moving from trapped regions near the neighboring gate 107*b* to the PN junction B (see FIG. 5) of the main gate 107*a*. As a result, instead of moving the PN junction B, the electrons move to the bit line contact 111 via the PN junction A (see FIG. 5) of the neighboring gate 107*b*. In addition, due to an electric field between the bit line 109 and the active region 103 that attracts the electrons to the bit line 109, it is difficult for the electrons to move to the PN junction B of the main gate 107*a*. As is apparent from the above description, the semiconductor device and the method for forming the same according to the embodiments can block a path of electrons moving between the main gate and the neighboring gate so as to prevent formation of failed parts in the semiconductor device, resulting in increased productivity of semiconductor devices.

Those skilled in the art will appreciate that embodiments may be carried out in other ways than those set forth herein without departing from the spirit and characteristics of the embodiment. The above-described embodiments are therefore to be construed in all aspects as illustrative and not restrictive.

The above embodiments are illustrative and not limitative. Various alternatives and equivalents are possible. The embodiments are not limited by the type of deposition, etching polishing, and patterning steps described herein. Nor are the embodiments limited to any specific type of semiconductor device. For example, the embodiments may be implemented in a dynamic random access memory (DRAM) device or non-volatile memory device.

What is claimed is:

1. A method for forming a semiconductor device, the method comprising:
   forming a device isolation film for defining an active region over a semiconductor substrate;
   forming a plurality of buried gates over the active region;
   exposing a sidewall of a lower portion of the active region by forming a hole in the device isolation film; and
   forming a barrier film by oxidizing the exposed sidewall of the lower portion of the active region.

2. The method according to claim 1, wherein the forming the device isolation film includes:
   forming a trench for forming the device isolation film in the semiconductor substrate;
   forming a liner insulation film along a surface of the trench; and
   forming the device isolation film over the liner insulation film by filling a remaining portion of the trench with an insulation material.

3. The method according to claim 2, further comprising:
   when the hole is formed, removing a first portion of the liner insulation film to expose the sidewall of the lower portion of the active region while a second portion of the liner insulation film on a sidewall of an upper portion of the active region remains.

4. A method for forming a semiconductor device comprising:
   forming a device isolation film for defining an active region over a semiconductor substrate;
   forming a plurality of buried gates over the active region;
   exposing a sidewall of a lower portion of the active region by forming a hole in the device isolation film; and
   forming an air-gap-shaped barrier film by selectively etching the lower portion of the active region.

5. The method according to claim 4, wherein:
   when the hole is formed, a first portion of a liner insulation film over the sidewall of the lower portion of the active region is removed while a second portion of the liner insulation film on a sidewall of an upper portion of the active region remains; and
   when the air-gap-shaped barrier film is formed, the lower portion of the active region is etched using the second portion of the liner insulation film on the sidewall of the upper portion of the active region as a mask.

6. The method according to claim 4, further comprising:
   after completion of the selective etching, forming an oxide film at a top surface and a bottom surface of the barrier film by oxidizing an exposed part of the selectively etched active region.

7. The method according to claim 4, further comprising:
   filling the hole with an insulation material.

8. A method for forming a semiconductor device, the method comprising:
   defining an active region comprising an ion implantation region in a semiconductor substrate;
   forming a first insulation film along a surface of the active region, and forming a second insulation film surrounding the ion implantation region; and
   forming a pair of buried gates at both sides of the ion implantation region in the active region, and
   wherein the ion implantation region has a first oxidation rate and the semiconductor substrate has a second oxidation rate.

9. The method according to claim 8, wherein the defining the active region includes:
   forming the ion implantation region by implanting ions into the semiconductor substrate; and
   forming a device isolation region by etching the semiconductor substrate in such a manner that the ion implantation region is contained in the active region.

10. The method according to claim 8, wherein the defining the active region includes:
    forming a device isolation region by etching the semiconductor substrate, thereby also defining the active region; and
    forming the ion implantation region by implanting ions into the active region.

11. The method according to claim 8, wherein the first insulation film and the second insulation film comprise oxide films and are simultaneously formed.

12. The method according to claim 8, wherein a top surface of the ion implantation region is higher in height than a bottom surface of one of the pair of buried gates.

13. The method according to claim 8, wherein the second oxidation rate is higher than the first oxidation rate.

14. The method according to claim 8, further comprising:
    forming the ion implantation region by implanting germanium (Ge) ions into the active region.

15. The method according to claim 8, wherein a height of the ion implantation region is less than a half of a height of the active region comprising the ion implantation region.

16. The method according to claim 9, further comprising:
    partially exposing a sidewall of the ion implantation region during the formation of the device isolation region.

17. The method according to claim 16, wherein the second insulation film is formed by oxidation through the exposed sidewall of the ion implantation region.

* * * * *